United States Patent [19]

Rumreich et al.

[11] Patent Number: 5,663,767
[45] Date of Patent: Sep. 2, 1997

[54] CLOCK RE-TIMING APPARATUS WITH CASCADED DELAY STAGES

[75] Inventors: Mark Francis Rumreich; John William Gyurek, both of Indianapolis, Ind.

[73] Assignee: Thomson Consumer Electronics, Inc., Indianapolis, Ind.

[21] Appl. No.: 547,830

[22] Filed: Oct. 25, 1995

[51] Int. Cl.$^6$ ............................................. H03L 7/00
[52] U.S. Cl. .................... 348/537; 327/161; 327/237; 327/269
[58] Field of Search ......................... 348/536, 537, 348/541; 327/276, 261, 263, 269, 270, 231, 233, 237, 239; 375/371, 373; H04N 5/04, 5/12

[56] References Cited

U.S. PATENT DOCUMENTS

| 4,638,360 | 1/1987 | Christopher et al. | 358/148 |
| 4,667,240 | 5/1987 | Willis et al. | 358/167 |
| 4,782,391 | 11/1988 | NcNeely et al. | 358/183 |
| 4,992,874 | 2/1991 | Willis et al. | 358/183 |
| 5,031,167 | 7/1991 | Ishibashi et al. | 369/44.34 |
| 5,309,111 | 5/1994 | NcNeely et al. | 328/133 |
| 5,365,128 | 11/1994 | Bazes | 327/141 |
| 5,374,860 | 12/1994 | Llewellyn | 327/276 |
| 5,487,095 | 1/1996 | Jordan et al. | 375/371 |

*Primary Examiner*—Michael H. Lee
*Attorney, Agent, or Firm*—Joseph S. Tripoli; Peter M. Emanuel; Robert D. Shedd

[57] ABSTRACT

A video clock input signal is applied to a delay line comprising a cascade connection of a plurality of delay elements formed in an integrated circuit for providing a plurality of delayed clock signals at respective taps of the delay line. A selection circuit, responsive to a horizontal synchronizing signal supplied thereto, couples a selected one of the taps to an output for providing a delayed output clock signal that is edge-aligned with the synchronizing signal. For reducing the number of taps required to provide a given minimum delay step resolution and a given minimum total delay for delay elements which may vary in delay, from one integrated circuit to another, the taps are spaced one element apart for a first group of the delay elements and are spaced more than one element apart for at least one second group of the elements.

13 Claims, 6 Drawing Sheets

TABLE OF COMPARATIVE NORMALIZED DELAY DISTRIBUTIONS

| TAP NUMBER | UNIFORM DELAY ELEMENTS | UNITARY DELAY ELEMENTS | HALF-UNIT DELAY ELEMENTS | CONTINUOUS DELAY ELEMENTS |
|---|---|---|---|---|
| 1 | 1 | 1 | 1 | 1.00 |
| 2 | 1 | 1 | 1 | 1.00 |
| 3 | 1 | 1 | 1 | 1.00 |
| 4 | 1 | 1 | 1 | 1.00 |
| 5 | 1 | 1 | 1 | 1.00 |
| 6 | 1 | 1 | 1 | 1.00 |
| 7 | 1 | 1 | 1 | 1.00 |
| 8 | 1 | 1 | 1 | 1.16 |
| 9 | 1 | 1 | 1 | 1.36 |
| 10 | 1 | 1 | 1.5 | 1.59 |
| 11 | 1 | 1 | 1.5 | 1.85 |
| 12 | 1 | 1 | 2 | 2.15 |
| 13 | 1 | 1 | 2 | 2.51 |
| 14 | 1 | 2 | 2.5 | 2.93 |
| 15 | 1 | 2 | 3 | 3.42 |
| 16 | 1 | 2 | 3.5 | 3.99 |
| 17 | 1 | 3 | 4 | |
| 18 | 1 | 3 | | |
| 19 | 1 | 4 | | |
| 20 | 1 | | | |
| 21 | 1 | | | |
| 22 | 1 | | | |
| 23 | 1 | | | |
| 24 | 1 | | | |
| 25 | 1 | | | |
| 26 | 1 | | | |
| 27 | 1 | | | |
| 28 | 1 | | | |
| TOTAL TAPS | 28 | 19 | 17 | 16 |
| TOTAL DELAY | 70 | 72.5 | 70 | 70 |

FIG. 4

DELAY LINE (CASCADE) 500

DELAY "SPREAD 4:1"
2.5 nS ≤ Δ ≤ 10 nS
DELAY ELEMENTS 2.5 nano-seconds each

CLOCK RE-TIMING APPARATUS WITH CASCADED DELAY STAGES

FIELD OF THE INVENTION

This invention relates to delay circuits and particularly to delay circuits with cascaded delay stages and a selector for re-timing clock signals.

BACKGROUND OF THE INVENTION

Delay circuits employing cascaded delay stages and a selection circuit for re-timing a clock signal with a synchronizing signal are well known and widely used, for example, in video signal synchronizing circuitry. An example is described by Willis et al. in U.S. Pat. No. 4,992,874 entitled METHOD AND APPARATUS FOR CORRECTING TIMING ERRORS AS FOR A MULTI-PICTURE DISPLAY which issued 12 Feb. 1991. Willis et al. describe a skew correction system for a television receiver with picture in picture (PIP) processing. An element of an embodiment of the Willis et al. PIP receiver includes a clock phase shifting circuit which re-times a sampling clock locked to burst of the main picture signal with a horizontal synchronizing signal derived from the picture display processing circuitry.

The present invention is directed to providing certain improvements in clock retiming circuitry of the general type described by Willis et al. to facilitate construction of the re-timing circuitry in an integrated circuit using standard semiconductor processing techniques. To understand the nature of the problems solved by the present invention, it is helpful first to consider an embodiment of the Willis et al. re-timing circuit in some detail. To this end, FIG. 1 herein, labeled "Prior Art" has been drawn based on the Willis et al. patent.

The clock re-timing apparatus 100 of FIG. 1, includes an input terminal 102 for receiving a main clock input signal MCK to be retimed or "edge aligned" with a horizontal synchronizing signal HS. The main clock input signal MCK is coupled via conductor 104 to the input of a tapped delay line 130 comprising 15 delay elements A1–A15. The delay line taps T1–T15 together with the un-delayed main clock input signal MCK are applied via bus 112 and conductor 104, respectively, to a memory unit 106 comprising fifteen "D" type flip-flops. All flip-flops in the memory unit 106 are clocked simultaneously by the leading edge of a horizontal synchronizing signal HS applied to input terminal 114. As a result, the fifteen flip-flops in memory 106 store what may be thought of as a "snap-shot" or "picture" of all of the delay line tap values at the time the horizontal synchronizing pulse arrives. Since there are 15 delays of, at least, 5 nano-seconds each, the stored tap values represent samples of one complete cycle (e.g., 70 nano-seconds, NTSC assumed) of the clock signal MCK at the instant of arrival of the horizontal synchronizing signal.

By comparing all fifteen tap values stored in flip-flops 106, it can be determined which tap output signal has its edge closest to the leading edge of horizontal sync HS. This identification is made by the multiplex selection logic unit 108 that receives the 15 stored tap values from memory unit 106 via the 15 conductor bus 118. From the 15 input tap delays, unit 108 provides on output signal on the 16 conductor bus 120 which identifies which of the 15 delayed signals at taps T1–T15 or the input signal (non delayed) has an edge or transition that is closest to the edge of horizontal sync signal HS. The closest tap signal, after identification by logic 108, is supplied via the 16 conductor bus 120 to a multiplex selection switch 110. The switch 110 then selects the one of the 15 tap signals (delayed) or the input signal (non-delayed) as an output signal YCK and applies this signal to output terminal 116 for the remainder of the horizontal line.

In the above manner the input master clock signal MCK is delayed by the tap identified by the selection logic unit 106 as being closest to the leading edge of horizontal sync and this tap is used for delaying all following master clock signals for the remainder of the horizontal line. When the next horizontal line begins, the edge of horizontal sync again latches all of the tap delay data in memory 106 and the cycle repeats. Accordingly, the master clock signal MCK is phase shifted by the selected tap delay to produce the phase shifted output clock YCK that is edge aligned with horizontal synchronizing signal HS.

SUMMARY OF THE INVENTION

The present invention is directed to a problem in re-timing apparatus of the type described which relates to variations in the propagation delay of the delay elements and the propagation delay of gate transitions in the multiplex selection logic 108 from one integrated circuit to another. Propagation delay variations are important because they can affect a number of re-timing parameters such as the numbers of delays and taps, and the choice of custom or standard cell fabrication techniques which, in turn, may also affect yields and costs of finished circuits.

More directly, in the foregoing description of the known retiming circuit there are a total of 15 taps and the master clock period was 70 nano-seconds. This value for period is based on an assumed NTSC standard signal sampled at a rate of four times the color subcarrier (4 Fsc). In order to provide a full cycle (70 nano-seconds) of delay for the master clock pulse MCK, the delay line must provide a delay which, at minimum, is in excess of 70 nano-seconds. For 15 taps, a delay of 5 nano-seconds per delay element will provide a minimum total delay time of 75 nano-seconds which meets the minimum total delay requirement for the line.

Another factor affecting the choice of tap delay is the visual resolution of the human eye. It has been found that a delay resolution of 10 nano-seconds or finer is necessary to make edge variations of vertical lines essentially imperceptible. The 5 nano-second delay is more than adequate in this respect. If one assumes a maximum delay of 10 nano-seconds based on visual perceptibility and a minimum delay of 5 nano-seconds per element for fifteen elements to provide the minimum total delay based upon the master clock period, then the maximum "spread" of delay values is in a ratio of two-to-one (2:1).

Re-timing circuits have been constructed using a semiconductor process with a batch-to-batch propagation delay variations of two-to-one for delay elements. However, this 2:1 ratio is a relatively close tolerance for processing with standard cell delay devices. To meet all of the criteria discussed above, it has heretofore been found to be necessary to utilize custom designed delay "cells" (elements) to obtain a delay variation or "spread" of which does not exceed a 2:1 ratio. By custom designing a delay element in a semiconductor process one may reduce the variation of delays from chip to chip to a factor of about two-to-one (2:1). On the other hand, there is a clear cost advantage in using standard cell delay elements even though the delay "spread" from chip to chip may be much wider, such as a four-to-one (4:1) ratio of maximum to minimum expected delays from batch-to-batch of integrated circuits.

Another problem in implementing the known re-timing circuit concerns the propagation delay of gates in the multiplex selection switch 108. Recall that logic 108 must make an identification of which tap signal is closest to the synchronizing signal edge. If one chooses a delay spread of 4:1, then the maximum delay per tap will be 10 nano-seconds (the threshold of perception) and the minimum delay will be 2.5 nano-seconds. For delay element delays of 2.5 nanoseconds, 30 delays will be needed to satisfy the requirement that the minimum total delay be greater than the clock period (>70 nS). But if there are 30 delays, there must also be 30 inputs to the selection logic 108 and this logic employs serial or "ripple" carry processing. The difficulty, is that if the total gate propagation delay time in selection logic 108 through 30 stages exceeds the period of the master clock, 70 nS, then selection logic 108 may fail to identify the closest MCK clock edge for failure to complete all processing of the 30 tap signals within one clock cycle.

The present invention is directed to meeting the need for clock re-timing apparatus suitable for construction in integrated circuit form with delay elements which may exhibit relatively wide propagation delay variations, such as four-to-one.

Delay apparatus embodying the invention comprises a cascade connection of a plurality of delay elements formed in an integrated circuit and responsive to a clock input signal for providing a plurality of delayed clock signals at respective taps. A selection circuit, responsive to a synchronizing signal supplied thereto, couples a selected one of the taps to an output for providing a delayed clock output signal that is edge-aligned with the synchronizing signal. The number of delay elements between selected taps varies.

BRIEF DESCRIPTION OF THE DRAWING

The invention is illustrated in the accompanying drawing wherein:

FIG. 4 is a Table of comparative normalized delay distributions for delay elements in the example of the invention of FIG. 2;

DETAILED DESCRIPTION

Figure 1:
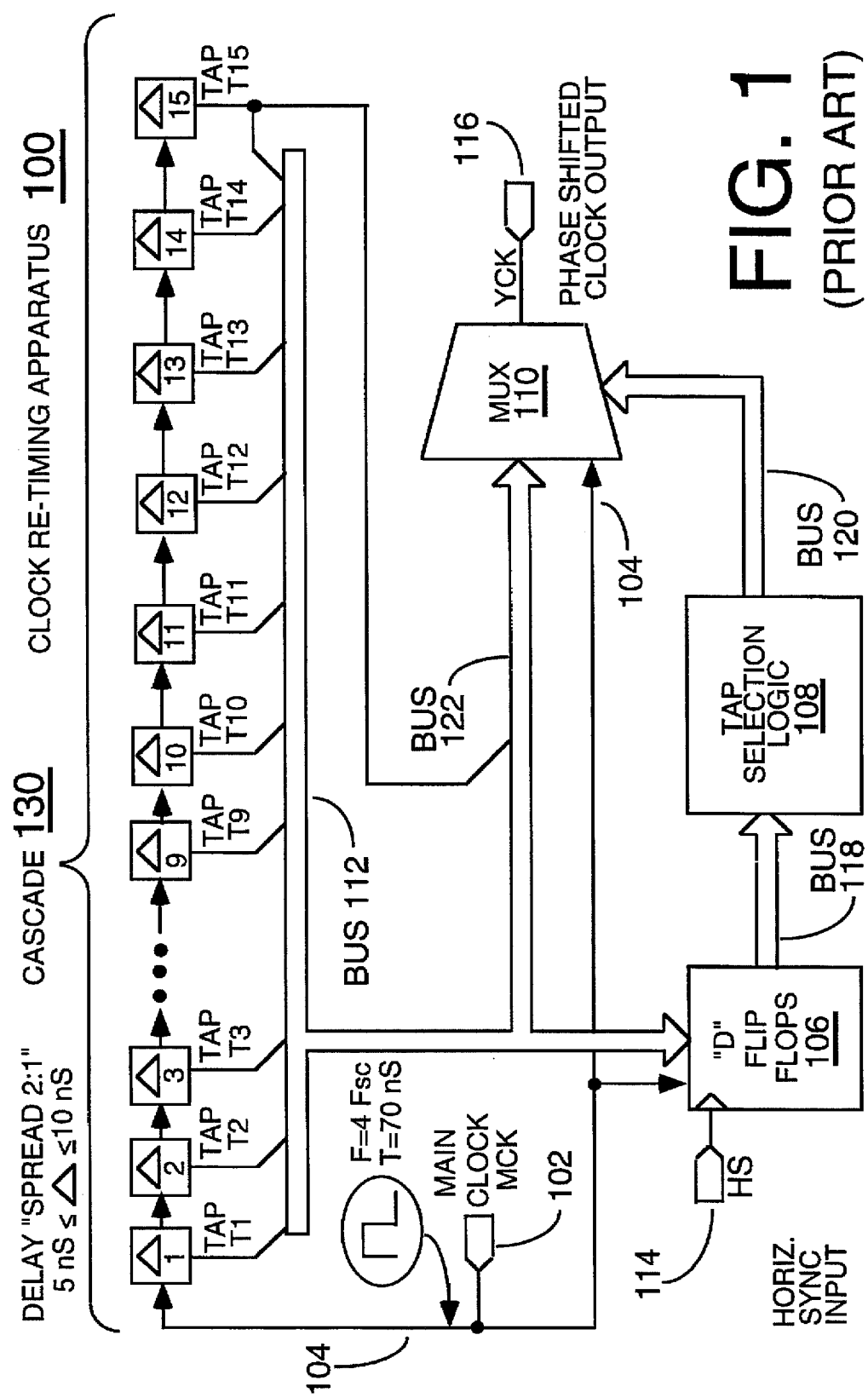
FIG. 1 is a block diagram of a clock re-timing apparatus known in the prior art.
Figure 2:
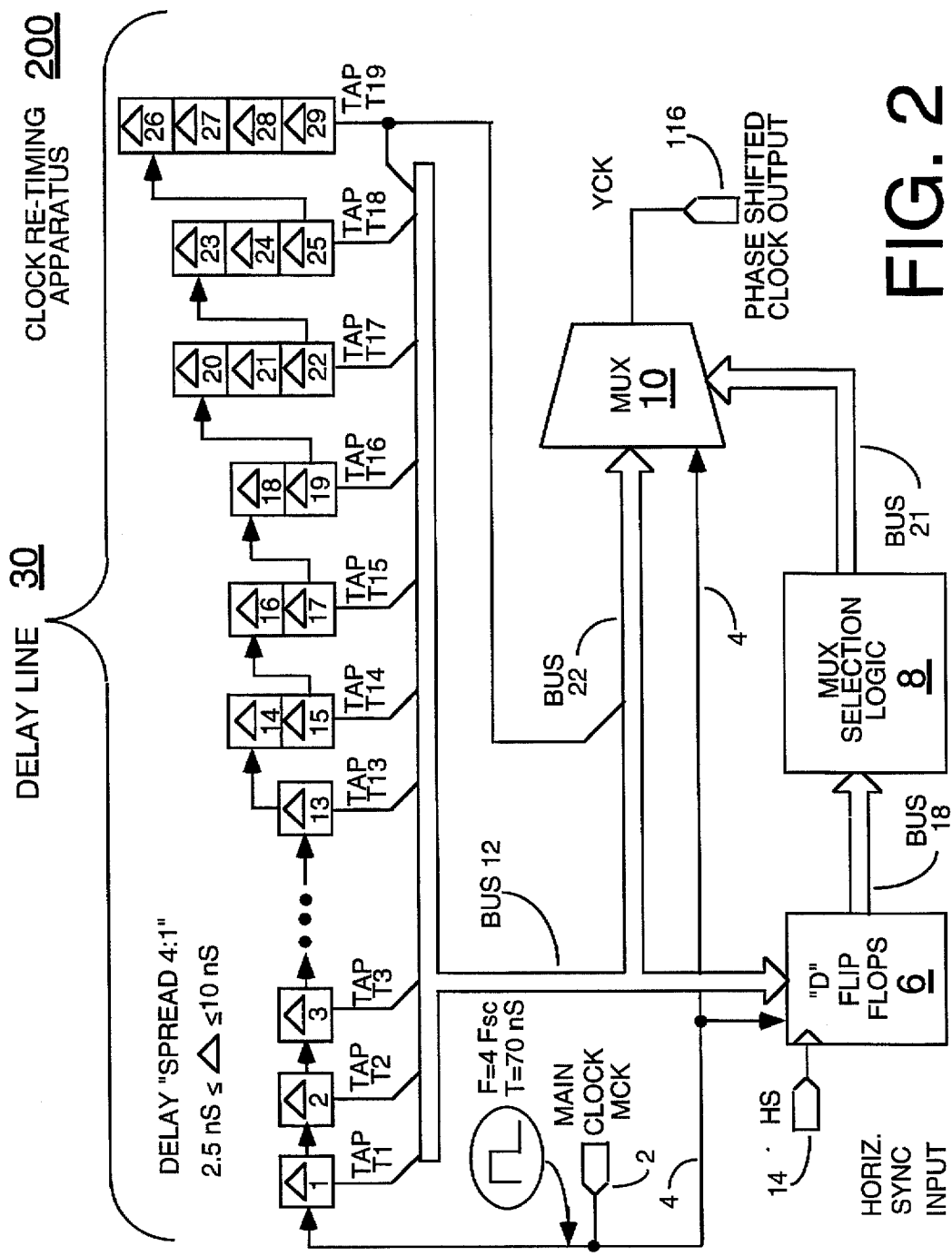
FIG. 2 is a block diagram of a clock re-timing apparatus embodying the invention.

The clock re-timing apparatus 200 of FIG. 2, embodying the invention, is designed for construction in integrated circuit form with conventional "standard cell" delay elements which may exhibit a batch-to-batch delay variation of up to a ratio of four-to-one (4:1) without requiring as many taps as would otherwise be required if the delay line were tapped at each of the 29 delay elements. This approach takes advantage of the fact that the only time that the rightmost (i.e., the last) tap can be selected is when the sub-element delay is substantially less than the 10 nano-seconds upper bound of visual perception. This principle allows the normal delay per tap to be geometrically increased along the delay line and still guarantee that the worst case delay per tap is less than the 10 nano-second requirement. Actually, as will be explained, the distribution of delay elements per tap is not simply geometric but includes a linear delay region and a progressive delay region. Detailed explanations of how to determine the delay distributions are discussed later in connection with FIG. 4.

Recall that the primary advantage of reducing the number of taps is to reduce the number of inputs to the tap selection logic unit 8. In this specific case there is a reduction of 28 taps for a linear delay line to 19 taps for a progressive delay line. The tap selection logic is a ripple type structure (shown in detail in FIG. 5) and thus has a propagation time proportional to the number of inputs. It must settle in less than one period (70 nSec.) of the master clock MCK and the use of graduated or progressive tap distributions, in accordance with the invention, is an effective way of meeting this requirement.

In more detail, the clock re-timing apparatus 200 of FIG. 2 includes an input terminal 2 for receiving a main clock input signal MCK to be retimed with respect to a horizontal synchronizing signal HS applied to an input terminal 14. The main clock input signal MCK is coupled via conductor 4 to the input of a tapped delay line 30 comprising 29 delay elements $\Delta1$–$\Delta29$. The delay elements are tapped at 19 points to provide 19 delayed tap signals (T1–T19) having a particular delay distribution discussed later.

The delayed tap signals, together with the un-delayed main clock input signal MCK, are applied via bus 12 and conductor 4, respectively, to a memory unit 6 comprising nineteen "D" or "data" type flip-flops. All flip-flops in the memory unit 106 are clocked simultaneously by the leading edge of the horizontal input signal HS at input terminal 14. As a result, the nineteen flip-flops in memory 6 store what may be thought of as a "snap-shot", a "picture" or a "profile" of waveform of one complete cycle of the master clock signal MCK in delay line 30 taken at the moment that the synchronizing signal HS arrives.

Figure 3A:
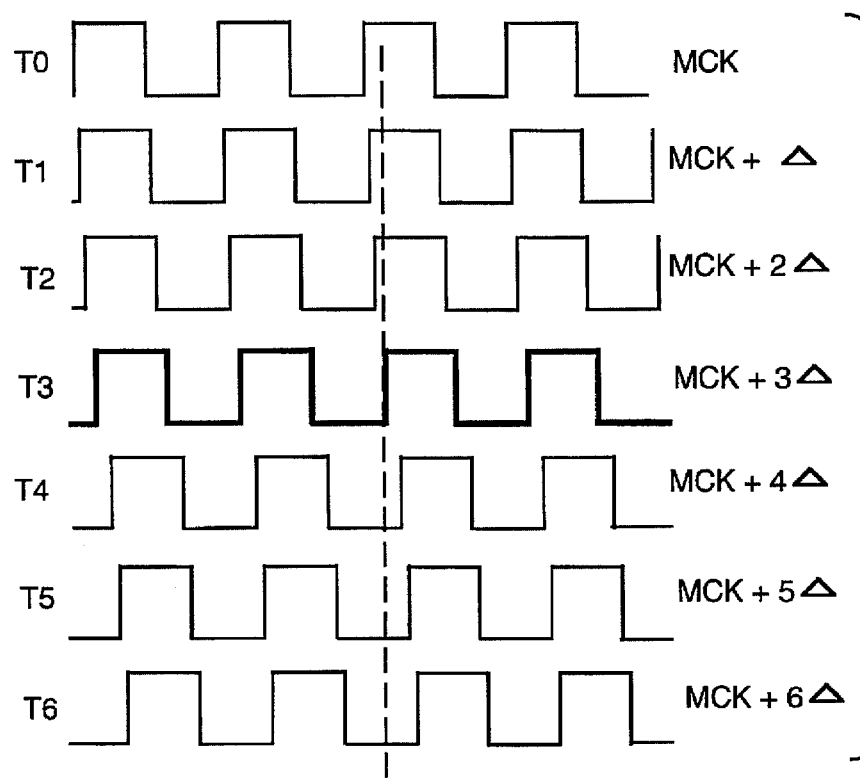
FIGS. 3A, 3B and 3C are detailed timing diagrams illustrating certain aspects of operation of the clock retiming apparatus of FIG. 2.

The "snapshot" of the master clock signal is illustrated in FIG. 3A by the waveforms T0 to T6. Waveform T0 is the master clock MCK applied to the delay line 30 input. The other waveforms correspond to the signals at taps T1–T6, respectively. There are, of course, a total of 19 tap waveforms but only six are shown to simplify the drawing.

Figure 3B:
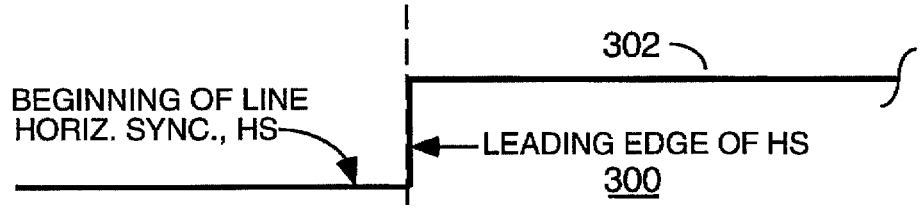
Figure 3C:
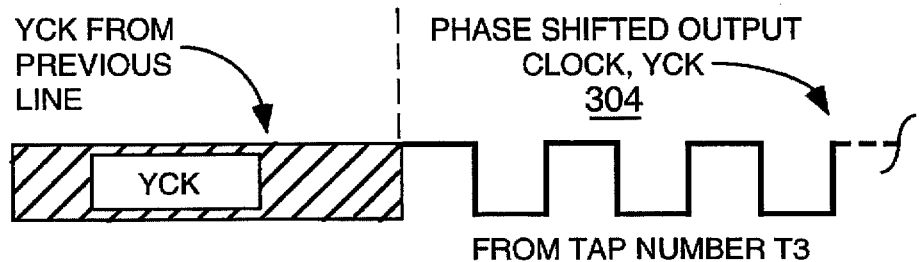

The vertical dashed line in FIGS. 3A and 3B, is aligned with the horizontal sync transition and identifies all of the tap values (e.g., binary one or binary zero) that are stored in memory 8 at the moment of the horizontal sync signal transition 300. By comparing all nineteen tap values stored in memory 6, one may determine which tap is closest to the leading edge of horizontal sync HS. This identification is made by the tap selection logic unit 8 that receives the 19 stored tap values from memory trait 6 via the bus 18. The closest tap in FIG. 3 is tap T3 (in bold) which corresponds to the signal of master clock MCK delayed by 3 delay elements.

Once the closest tap is identified, the tap selection logic 8 sends a signal on one of the conductors of bus 21 to multiplex switch 10. This causes multiplex switch 10 to connect tap T3 to the output terminal 116. This is illustrated by the signal YCK waveform shown in FIG. 3C which shows that the leading edge of the re-timed clock signal YCK is aligned with the leading edge of the horizontal synchronizing signal HS and the signal itself corresponds to the master clock signal MCK delayed by three delay elements. The area before the horizontal sync transition is hatched to signify that the previous phase of signal YCK is of no concern. This follows since no data from the previous line is needed for determining the delay of the current line.

Delays, in other words, are determined anew on a line-by-line basis and so the delay of the previous line is of no consequence in determining the delay of the current line.

Briefly summarizing to this point, the input master clock signal MCK is delayed by the tap selected in delay line 30 by the selection logic unit 6 from the stored tap data in memory 106 and this tap is connected to the output terminal 116 by multiplex switch 10 thus delaying all following master clock signals for the remainder of the horizontal line. When the next horizontal line begins, the edge of horizontal sync again latches all of the tap delay data in memory 106 and the cycle repeats. Accordingly, the master clock signal MCK is phase shifted by the selected tap delay to produce the phase shifted out-put clock YCK 304 that is edge aligned with horizontal synchronizing signal HS. All the following clock cycles for the remainder of a horizontal line are thus synchronized with the horizontal sync signal HS. When the next horizontal signal appears, the process repeats with the output clock YCK being synchronized with the synchronizing signal HS so that the retimed clock signal YCK is up-dated for every horizontal line.

Delay line 30 in FIG. 2 is intended to be fabricated with delay elements which may have a delay variation, from batch to batch, of four-to-one (4:1) and specifically from a minimum of 2.5 nano-seconds to a maximum of 10 nano-seconds. By the term batch to batch variation, it is meant that in one production run of clock re-timing circuits the delays may all be 2.5 nano-seconds and in another production run the delays may all be 10 nano-seconds. In delay line 30 the total number of delay elements is increased to 29 thus providing a maximum delay of 72.5 nano-seconds for the overall line under the worst case condition of all delay elements being 2.5 nano-seconds. This delay, 72.5 nano-seconds, is greater than the period of the master clock which is 70 nano-seconds (NTSC signal assumed with clocking at four times the color subcarrier) and therefore covers a full range of phase relationships between the main clock MCK and the leading edge of horizontal synchronizing signal HS.

The "delay distribution" of delay elements per tap is shown in the example of FIG. 2 where it is seen that there are 29 delay elements and only 19 taps and the tap distribution is not uniform. The first 13 taps, for example, are "spaced" one delay element apart, the next 3 taps are spaced two delay elements apart, the following two taps are spaced three delays apart and the final delay tap 19 is spaced four delay elements from the preceding tap 18. This distribution provides a resolution per tap of at least ten micro-seconds for delay element variations over a 4:1 range.

FIG. 4 provides a tabular presentation of the delay distribution for FIG. 2 and for three other cases as well. In FIG. 4 the first column is the tap number for delay line 30. The second column labeled "uniform delay elements" illustrates that for a linear delay line with 1 delay element between each tap, the total number of taps required would be 28 to provide a minimum total delay of 70 nano-seconds. The column labeled "unitary delay elements" is a listing of the elements per tap for the example of FIG. 2. As shown, the number of taps is reduced to 19 for a minimum total delay of 72.5 nano-seconds. This is a significant reduction as compared with the 28 taps required for a linear delay line. The column labeled half unit delay elements is an example of a delay distribution which may be used if one has delay elements of 1.25 micro-seconds available (half of 2.5 microseconds). As shown, there is a further reduction of two taps but more delay elements are required.

The last column in the table of FIG. 4 illustrates the tap requirements if one had a standard cell library containing continuously adjustable delay elements. This case also represents the absolute minimum number of taps for a re-timing circuit meeting the specific requirements of total delay, delay resolution, delay spread, etc. of the illustrated embodiment. As seen, the continuous case approaches a maximum tap delay of 4.00 units in only 16 taps. This is one better than the semitary example and 3 better than the unitary example. Never the less, when one considers construction of unitary delays or the need for extra delays in the semitary example, the clear preference is the simple unitary version of FIG. 2.

Calculation of specific delays per tap is not a simple matter but may be easily understood by considering the following equations which govern the delay distribution and some associated examples. Consideration will first be given to calculation of the tap delays for the continuous delay case. The discrete delay cases, discussed later, are essentially integer extensions of the continuous case.

In the continuous case the first seven taps must equal one "standard delay element" each. Since the coarsest delay element can not be more than 10 nano-seconds to meet the visual resolution requirements previously discussed, and since the total delay must equal 70 nano-seconds, at least 7 delay elements of 10 nano-seconds each are required to produce the minimum total of 70 nano-seconds and a uniform delay resolution, from tap to tap, of 10 nano-seconds. Accordingly, in the "continuous delay" column in FIG. 4, the first seven taps are listed as 1.00 each. All listed values are normalized against what will be termed a "standard delay element" which can be any value between 2.5 and 10 nano-seconds depending on the manufacturing process. The actual delay is then obtained by multiplying the "standard delay element" value by the normalized value.

The next tap, tap number 8, and all subsequent taps, are calculated by the following relationships for a 4:1 spread, 10 nano-second maximum tap difference and at least 70 nano-seconds total delay (the reciprocal of the master clock MCK). First, for the Nth tap it is noted that:

$$(\Sigma + Xn)T = 70 \text{ns} \quad (1)$$

$$XnT = 10 \text{ns} \quad (2)$$

$$Xn = (\tfrac{1}{6})(\Sigma) = 0.16666\Sigma \quad (3)$$

In equations 1–3 above:

Σ is the sum of the normalized delays of all stages preceding the Nth stage (e.g., stages from N to N-1).

T is the delay per "standard delay element".

Xn is the normalized incremental delay (e.g., this is the incremental delay divided by the delay per "standard delay element") for a given stage "n" for the case where delay elements may be varied on a continuous basis (FIG. 4, right most column).

10, is a 10 nano-second constant corresponding to the minimum acceptable resolution and 70, is a 70 nano-second constant that corresponds to the minimum total delay for the whole line. This equals the reciprocal of the master clock signal MCK.

Equation (1) above indicates that the sum of the current delay and all previous delays must equal a minimum value of 70 nano-seconds, which is the period of the master clock MCK. Equation (2) defines the normalized incremental delay in terms of the minimum acceptable resolution (e.g., 10 nano-seconds). By combining equations (1) and (2) above and solving for Xn, one obtains equation (3) which provides a value that is the normalized incremental delay for the Nth tap in a progressively weighted delay line.

As an example of the use of equation (3), the normalized incremental delay value for the Nth stage is determined by taking one sixth of the sum of the normalized delays of all previous stages (N-1). In any delay line for the above specifications, there must be at least seven delays of unity value since the delays may be as much as nano-seconds thus equaling the total delay for the delay line. Thus, each of the first seven stages must have a normalized incremental delay of "1". For stage 8, the sum of the previous stages is 7 so for stage 8 the normalized incremental delay is ("X") 0.16666 (7) which equals 1.16666. This is shown as the entry in the "continuous" column in FIG. 4 for tap 8. Adding the normalized incremental delay (1.1666) for tap 8 to the previous 7 taps gives a total of 8.1666 for the sum of all previous normalized incremental delays. Dividing this (8.1666) by 6 gives the normalized incremental delay of 1.3611 for the 9th tap. By repeating this proceedure, the normalized incremental delays may be calculated for all the taps as shown in FIG. 4.

The calculation of the discrete values of normalized incremental delays is similar to calculation of the continuous values except that the normalized incremental value for any stage is not added to the previous stun unless it is an integer. As an example, starting with stage 8, the normalized incremental values are 1.1666, 1.250, 1.500; 1.6666; and 1.811 for taps 8–12. None of these are integers. None are added when applying equation (3) so taps 1–12 all have normalized incremental values of 1 and the sum Σ equals 12.

Tap 13 is the first tap in this example which has a normalized incremental value that is an integer step. Specifically, for tap 13 the sum of all previous normalized values is 12 and 12 divided by 6 equals 2. Accordingly, there are two delay elements between tap 13 and the next tap and the normalized incremental tap value (for use with tap 14) is advanced by "2". Eventually the normalized incremental values increase in steps of "3" and finally the last step is a value of "4" (meaning that 4 stages of 2.5 nano-seconds each are required)

Figure 5:
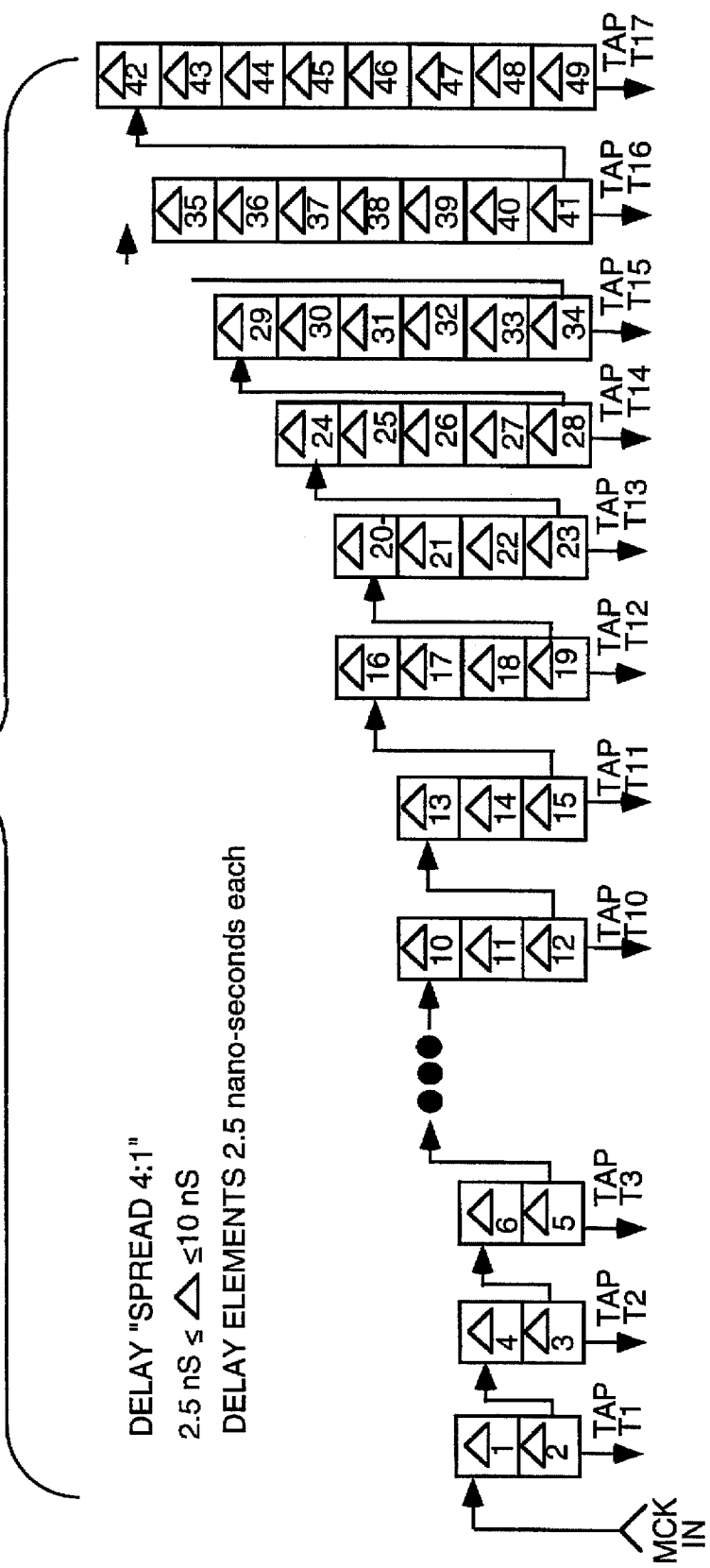
FIG. 5 is a block diagram illustrating a modification of the apparatus of FIG. 2.

FIG. 5 is an example of a delay distribution met by the use of "half delay" elements of 1.25 nano-seconds each. These half-elements implement the distribution in FIG. 4 for the half-unit column. As shown, only 17 taps are needed (2 less than for the unitary example) but 49 delays are used. As a practical matter fewer delays could be used if both 2.5 and 1.25 nano-second delays could be formed on the integrated circuit.

Figure 6:
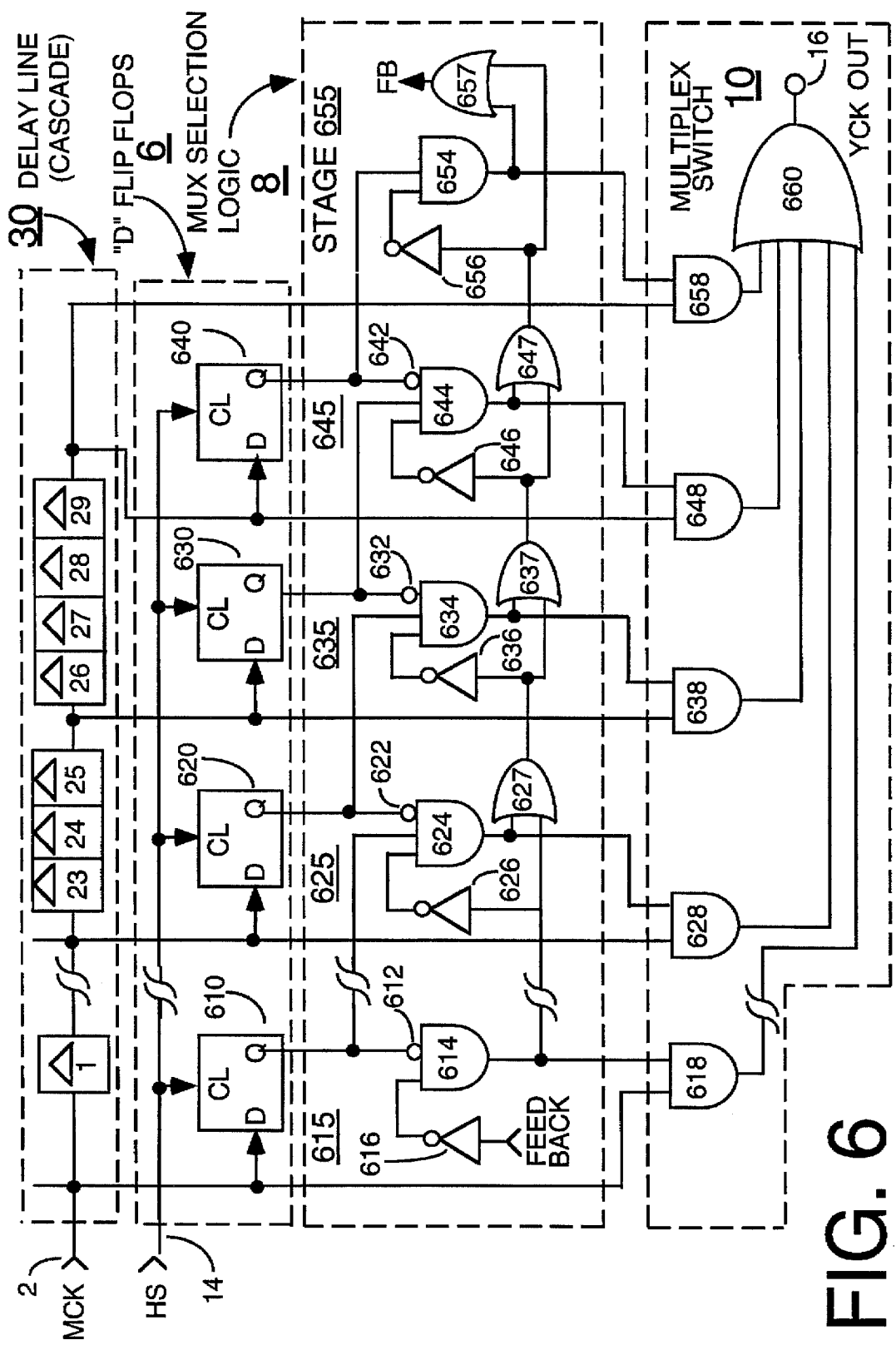
FIG. 6 is a logic diagram illustrating tap selection circuitry suitable for use in the example of FIG. 2.

FIG. 6 illustrates logic circuit details suitable for implementing the re-timing apparatus of FIG. 2. The flip-flops, selection circuit and multiplex switch circuits are similar for each tap so only a few stages are shown to simplify the drawing. Exceptions are the first and last stages which provide feedback to stop the selection process after the leading edge of sync is reached. Essentially the D flip-flops 6, the mux selection logic 8 and the switch 10 are as shown in the previously mentioned Willis et al. U.S. Pat. No. 4,992,874 and so only a brief description will be provided here. The overall circuit operation is exactly as previously discussed in the example of FIG. 2 and the related FIGS. 3 and 4.

Responsive to a positive-going transition of the master clock signal MCK, instantaneous samples of each of the different phases of the signal MCK are stored in respective D type flip-flops (610, 620, 630, 640) of memory 6. Since the total delay provided by the delay line 30 approximates one period of the master clock signal MCK, the values stored in these flip-flops represents a "snapshot" of all of the phases of the clock signal MCK at the different taps, taken at the transition of the synchronizing signal HS.

If this "snapshot" includes a positive going transition of the master clock signal, one of the flip flops, for example 620, will have a logic-one output signal and the next successive flip flop, 630, will have a logic zero output signal. In this instance, all of the input signals to an AND gate 634 of tap selection logic unit 8 will be logic one. In this instance, the output signal of the AND gate 634 will enable the clock phase signal provided by tap 18 to pass through an AND gate 638 and an OR gate 660 (in multiplex switch 10) as the output signal of the re-timing apparatus and tap 18 remains connected to the output terminal 16 for the remainder of the horizontal line interval until the next synchronizing pulse appears.

When the tap logic levels or "snapshot" stored in memory 6 includes more than one transition, inhibiting circuitry which includes inverters 616, 636, 646 and 656 allows only the clock signal phase corresponding to the first transition to be selected as the delayed clock output signal YCK. When the "snapshot" includes only a negative going transition, or when the sample values held in the flip flops are all logic one, indicating no captured transition, the clock signal phase provided by the delay element 29 at tap 19 is selected as the phase aligned output signal YCK. This selection is accomplished by the "pseudo-stage" 655. Finally, when the "snapshot" does not include any transitions but the values held in the various flip flops are all logic zero, the signal of the master clock MCK is selected as the phase aligned output signal YCK by action of AND gates 614 and 618 and an inverter 616.

What is claimed is:

1. Integrated clock re-timing apparatus, comprising:

a delay line comprising a cascade connection of a plurality of delay elements formed in an integrated circuit and responsive to a clock input signal for providing a plurality of delayed clock signals at respective taps;

a selection circuit, responsive to a synchronizing signal supplied thereto, for coupling a selected one of the taps to an output for providing a delayed clock output signal that is edge-aligned with the synchronizing signal; and wherein the number of delay elements between some taps varies;

each delay element in said delay line is of a given nominal delay;

said delay elements are arranged in said delay line to form a distribution of delay elements wherein there are fewer taps than delay elements;

said distribution of delay elements among said taps is selected to minimize the number of taps required to provide a given minimum delay resolution and a given minimum total delay for said delay line; and wherein said minimum total delay is at least one period of said input clock signal.

2. Apparatus as in claim 1 wherein:

the number of delay elements between taps is constant for a first group of taps in a first portion of said delay line and is graduated for a second group of taps in a following second portion of said delay line.

3. Apparatus as in claim 2 wherein:

said first group of said taps in said first portion of said delay line are spaced one delay element apart for a given number of delay elements in said cascade; and said second group of said taps in said following second portion of said delay line are spaced at least two delay elements apart for a predetermined number of said taps.

4. Apparatus as in claim 1 wherein:

said minimum delay resolution is about ten microseconds.

5. Apparatus as in claim 1 wherein the delay elements within a given integrated circuit are of said given nominal delay; and wherein said delay line is formed using a given semiconductor process of a selected type wherein the delay elements of one integrated circuit may differ in said given nominal delay from those of another integrated circuit by a factor of greater than two-to-one.

6. Integrated video clock retiming apparatus, comprising:

a pixel clock signal source providing a pixel clock signal at an integer multiple of a given color subcarrier frequency;

a horizontal synchronizing signal source providing a horizontal synchronizing signal;

a delay line comprising a cascade connection of a plurality of delay elements formed in an integrated circuit and responsive to said pixel clock signal source for providing a plurality of delayed pixel clock signals at respective taps;

a selection circuit formed in said integrated circuit and responsive to said horizontal synchronizing signal of said horizontal synchronizing signal source for coupling one of said taps to an output for providing a re-timed pixel clock output signal that is edge-aligned with said horizontal synchronizing signal;

each delay element in said delay line is of a predetermined nominal delay; and there are fewer taps than delay elements in said delay line so as to form a distribution of tap delays selected to minimize the number of taps required to provide a given minimum delay resolution and a given minimum total delay for said delay line.

7. Apparatus as in claim 6, wherein:

said delay elements in said delay line are formed using a selected semiconductor process exhibiting a range of delay variations from one integrated circuit to another that may vary over a predetermined range of greater than two-to-one.

8. Apparatus as in claim 6 wherein:

said given minimum total delay is at least one period of said pixel clock signal.

9. Apparatus as in as in claim 6 wherein:

said given minimum delay resolution is about ten microseconds.

10. Apparatus as in claim 6 wherein:

said taps in said delay line number nineteen and said delay elements in said delay line number twenty nine.

11. A method for retiming a pixel clock input signal to align with a horizontal synchronizing signal, comprising the steps of:

applying said pixel clock signal to an integrated circuit tapped delay line to produce a plurality of progressively delayed pixel clock signals at respective output taps of said delay line;

coupling one of said taps to an output terminal upon a given transition of said horizontal synchronizing signal to provide a re-timed pixel output clock signal that is edge-aligned with said horizontal synchronizing signal;

forming each delay element in said delay line to provide a given nominal delay;

tapping selected outputs of said delay elements in said delay line such that there are fewer taps than delay elements; and selecting a non-linear distribution of delay time per tap so as to minimize the number of taps required to provide a given minimum delay resolution of said re-timed pixel clock output signal and to provide a given minimum total delay for said tapped delay line.

12. A method as recited in claim 11 wherein the step of selecting said predetermined non-linear distribution of delay time per tap comprises:

distributing a first group of delay elements in said delay line to provide a constant delay per tap equal to said nominal delay per element and distributing a second group of delay elements in said delay line to provide progressively larger delays per tap by including more delay elements between taps in said second group.

13. A method as recited in claim 12 further comprising:

selecting as said minimum delay resolution of said re-timed pixel clock a time period of about ten microseconds; and selecting as said minimum total delay for said delay line a time period substantially equal to the period of said pixel clock signal.

* * * * *